US012238968B2

(12) United States Patent
Liu et al.

(10) Patent No.: US 12,238,968 B2
(45) Date of Patent: Feb. 25, 2025

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Jun Liu, Hubei (CN); Wei Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 634 days.

(21) Appl. No.: 17/600,062

(22) PCT Filed: Sep. 2, 2021

(86) PCT No.: PCT/CN2021/116139
§ 371 (c)(1),
(2) Date: Sep. 29, 2021

(87) PCT Pub. No.: WO2023/024139
PCT Pub. Date: Mar. 2, 2023

(65) Prior Publication Data
US 2023/0053413 A1 Feb. 23, 2023

(30) Foreign Application Priority Data
Aug. 23, 2021 (CN) .......................... 202110966560.2

(51) Int. Cl.
*H10K 59/121* (2023.01)
*H01L 27/12* (2006.01)
(Continued)

(52) U.S. Cl.
CPC ....... *H10K 59/1213* (2023.02); *H10K 59/131* (2023.02); *H01L 27/124* (2013.01)

(58) Field of Classification Search
CPC ............. H10K 59/1213; H10K 59/131; H10K 59/352; H10K 59/353; H10K 59/121; H01L 27/124
See application file for complete search history.

(56) References Cited

U.S. PATENT DOCUMENTS

2015/0357383 A1* 12/2015 Chung ................. H10K 59/179
257/40
2018/0061908 A1* 3/2018 Shim .................... H10K 59/351
(Continued)

FOREIGN PATENT DOCUMENTS

| CN | 110874990 A | 3/2020 |
| CN | 111028692 A | 4/2020 |

(Continued)

OTHER PUBLICATIONS

International Search Report issued in corresponding International Application No. PCT/CN2021/116139, dated Apr. 25, 2022, 10 pages, machine translation provided.
(Continued)

*Primary Examiner* — Omar F Mojaddedi
(74) *Attorney, Agent, or Firm* — HSML P. C.

(57) ABSTRACT

Disclosed is a display panel. The display panel includes a first display area and a second display area. The second display area includes a transparent display area, a drive display area, and a transition display area. An arrangement density of third pixel driving circuits in the transition display area is less than or equal to an arrangement density of second pixel driving circuits in the drive display area.

13 Claims, 10 Drawing Sheets

(51) Int. Cl.
*H10K 59/131* (2023.01)
*H10K 59/35* (2023.01)

(56) References Cited

U.S. PATENT DOCUMENTS

2019/0173057 A1* 6/2019 Jung .................... H10K 59/121
2020/0074938 A1* 3/2020 Kim ..................... G09G 3/3233
2022/0013067 A1* 1/2022 Li ........................ H10K 59/131

FOREIGN PATENT DOCUMENTS

| CN | 112102783 A | 12/2020 |
| CN | 113140609 A | 7/2021 |
| KR | 20150140498 A | 12/2015 |

OTHER PUBLICATIONS

Written Opinion of the International Search Authority issued in corresponding International Application No. PCT/CN2021/116139, dated Apr. 25, 2022, 7 pages, machine translation provided.

* cited by examiner

DISPLAY PANEL

FIELD OF INVENTION

The present disclosure relates to display technologies, and more particularly, to a display panel.

BACKGROUND OF INVENTION

With the rapid development of display technologies, high screen-to-body ratio has become a hot spot in the field of small-size display panels. To achieve a true full screen, the current under-screen camera technology places optical modules, such as front cameras, infrared sensing devices, and fingerprint readers, in a display area. When the optical modules are required to be used, light penetrates the display panel to reach the optical modules and is finally utilized by the optical modules.

To improve a transmittance of a camera under panel (CUP) area, in a design scheme, the CUP area is divided into a drive area and a high-transmittance area, and light emission of pixels in the CUP area is controlled by a drive unit of the drive area. In addition, photosensitive devices of the optical modules are placed in the high-transmittance area with the largest transmittance, to ensure that the optical modules can receive a sufficient amount of light. As shown in FIG. 1, FIG. 1 is a design solution of a CUP area in the related art. FIG. 1 is only a partial schematic diagram of a display panel in a CUP area. The display panel includes a normal display area AA and a CUP area TA. The CUP area TA includes a drive area A, a transition drive area B, and a high-transmittance area C. The drive area A is provided with a drive unit, and the high-transmittance area C is not provided with a drive unit. Therefore, display pixels located in the high-transmittance area C are electrically connected to the drive unit located in the drive area A through wiring disposed in the transition drive area B to emit light. In this way, the light transmittance of the high-transmittance area C is improved. However, metal wiring densities of the drive area A and the transition drive area B in this design solution are apparently different, which causes the problem of uneven display in the two areas, thereby severely affecting the display effect.

SUMMARY OF INVENTION

Therefore, there is an urgent need to alleviate the technical problem in the related art of uneven display in the drive area A and the transition drive area B due to the different metal wiring densities of the two areas.

An objective of the present disclosure is to provide a display panel, to resolve the technical problem in the related art of uneven display in the drive area A and the transition drive area B due to the different metal wiring densities of the two areas.

To resolve the problem above, the present disclosure provides a display panel. The display panel includes: a first display area, including a plurality of first display pixels and a plurality of first pixel driving circuits that are arranged in an array, the first pixel driving circuits being electrically connected to the first display pixels; and a second display area, including a transparent display area, a drive display area located between the transparent display area and the first display area, and a transition display area located between the transparent display area and the drive display area, and/or located between the drive display area and the first display area, wherein the second display area further includes a plurality of second display pixels arranged in an array, the drive display area includes a plurality of second pixel driving circuits, the second pixel driving circuits are electrically connected to the second display pixels, and the transition display area includes a plurality of third pixel driving circuits; and an arrangement density of the third pixel driving circuits in the transition display area is less than or equal to an arrangement density of the second pixel driving circuits in the drive display area.

In some embodiments, the drive display area includes a plurality of first pixel driving circuit islands, and the first pixel driving circuit islands include the plurality of second pixel driving circuits; and the transition display area includes a plurality of second pixel driving circuit islands, and the second pixel driving circuit islands include the plurality of third pixel driving circuits.

In some embodiments, an arrangement density of the first pixel driving circuit islands in the drive display area is greater than or equal to an arrangement density of the second pixel driving circuit islands in the transition display area.

In some embodiments, an arrangement density of the second pixel driving circuits in an area occupied by the first pixel driving circuit islands is greater than or equal to an arrangement density of the third pixel driving circuits in an area occupied by the second pixel driving circuit islands.

In some embodiments, an arrangement density of the first pixel driving circuits in the first display area is less than an arrangement density of the third pixel driving circuits in the transition display area.

In some embodiments, the third pixel driving circuits are not electrically connected to the first display pixels and the second display pixels.

In some embodiments, the second pixel driving circuits provide driving signals to the second display pixels, and the third pixel driving circuits do not provide driving signals to the first display pixels and the second display pixels.

In some embodiments, the second pixel driving circuit includes a semiconductor layer, a first metal layer, a second metal layer, and a third metal layer stacked from bottom to top, the first metal layer includes a scan line and a light-emitting control signal line, the second metal layer includes a reset line, the third metal layer includes a data line and a power supply voltage line, and the third metal layer is electrically connected to the semiconductor layer, the second metal layer, and the first metal layer using a first via, a second via, and a third via respectively; and the third pixel driving circuit includes the semiconductor layer, the first metal layer, the second metal layer, and the third metal layer stacked from bottom to top, the first metal layer includes the scan line and the light-emitting control signal line, the second metal layer includes the reset line, the third metal layer includes the data line and the power supply voltage line, and the third pixel driving circuit is not provided with at least one of the first via, the second via, or the third via.

In some embodiments, the first via includes a first sub-via electrically connected to the data line and the semiconductor layer and a second sub-via electrically connected to the power supply voltage line and the semiconductor layer, and the third pixel driving circuit is not provided with the first sub-via and/or the second via.

In some embodiments, the third pixel driving circuit is not provided with the first via, the second via, and the third via.

The present disclosure provides another display panel. The display panel includes: a first display area, including a plurality of first display pixels and a plurality of first pixel driving circuits that are arranged in an array, the first pixel driving circuits being electrically connected to the first display pixels; and a second display area, including a transparent display area, a drive display area located between the transparent display area and the first display area, and a transition display area located between the transparent display area and the drive display area, and/or located between the drive display area and the first display area, wherein the second display area further includes a plurality of second display pixels arranged in an array, the drive display area includes a plurality of second pixel driving circuits, the second pixel driving circuits are electrically connected to the second display pixels, and the transition display area includes a plurality of third pixel driving circuits; and the third pixel driving circuits are not electrically connected to the first display pixels and the second display pixels, or the third pixel driving circuits do not provide driving signals to the first display pixels and the second display pixels.

In some embodiments, the drive display area includes a plurality of first pixel driving circuit islands, and the first pixel driving circuit islands include the plurality of second pixel driving circuits; and the transition display area includes a plurality of second pixel driving circuit islands, and the second pixel driving circuit islands include the plurality of third pixel driving circuits.

In some embodiments, an arrangement density of the first pixel driving circuit islands in the drive display area is greater than or equal to an arrangement density of the second pixel driving circuit islands in the transition display area.

In some embodiments, an arrangement density of the second pixel driving circuits in an area occupied by the first pixel driving circuit islands is greater than or equal to an arrangement density of the third pixel driving circuits in an area occupied by the second pixel driving circuit islands.

In some embodiments, an arrangement density of the first pixel driving circuits in the first display area is less than an arrangement density of the third pixel driving circuits in the transition display area.

In some embodiments, the second pixel driving circuit includes a semiconductor layer, a first metal layer, a second metal layer, and a third metal layer stacked from bottom to top, the first metal layer includes a scan line and a light-emitting control signal line, the second metal layer includes a reset line, the third metal layer includes a data line and a power supply voltage line, and the third metal layer is electrically connected to the semiconductor layer, the second metal layer, and the first metal layer using a first via, a second via, and a third via respectively; and the third pixel driving circuit includes the semiconductor layer, the first metal layer, the second metal layer, and the third metal layer stacked from bottom to top, the first metal layer includes the scan line and the light-emitting control signal line, the second metal layer includes the reset line, the third metal layer includes the data line and the power supply voltage line, and the third pixel driving circuit is not provided with at least one of the first via, the second via, or the third via.

In some embodiments, the first via includes a first sub-via electrically connected to the data line and the semiconductor layer and a second sub-via electrically connected to the power supply voltage line and the semiconductor layer, and the third pixel driving circuit is not provided with the first sub-via and/or the second via.

The beneficial effect of the present disclosure is that, the display panel of the present disclosure is provided with the plurality of third pixel driving circuits in the transition display area, and the arrangement density of the third pixel driving circuits is less than or equal to the arrangement density of the second pixel driving circuits in the drive display area. Therefore, the technical problem in the related art of uneven display in the drive area A and the transition drive area B due to the different metal wiring densities of the two areas can be resolved, thereby improving the display effect of a CUP area.

Further, the third pixel driving circuits are not electrically connected to the first display pixels and the second display pixels. That is, according to the present disclosure, the driving circuits (that is, dummy driving circuits) that cannot drive the display pixels to emit light are provided in the transition display area. Therefore, without affecting the inherent circuit design of the display panel, the technical problem in the related art of uneven display in the drive area A and the transition drive area B due to the different metal wiring densities of the two areas can be resolved.

BRIEF DESCRIPTION OF DRAWINGS

To describe the technical solutions in the embodiments of the present disclosure more clearly, the accompanying drawings required for describing the embodiments are briefly described hereinafter. Apparently, the accompanying drawings in the following descriptions show merely some embodiments of the present disclosure, and a person of ordinary skill in the art may obtain other accompanying drawings according to these accompanying drawings without creative efforts.

DETAILED DESCRIPTION OF PREFERRED EMBODIMENTS

The following clearly and completely describes technical solutions in the embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts fall within the protection scope of the present disclosure.

In the description of the present disclosure, it should be understood that orientation or position relationships indicated by the terms such as "center", "longitudinal", "transverse", "length", "width", "thickness", "on", "below", "front", "back", "left", "right", "vertical", "horizontal", "top", "bottom", "inside", "outside", "clockwise", and "anti-clockwise" are based on orientation or position relationships shown in the accompanying drawings, and are used only for ease and brevity of illustration and description of the present disclosure, rather than indicating or implying that the mentioned apparatus or component shall have a particular orientation or be constructed and operated in a particular orientation. Therefore, such terms should not be construed as limiting of the present disclosure. In addition, the terms "first" and "second" are used for descriptive purposes only and are not to be construed as indicating or implying relative importance or implicitly indicating the number of technical features indicated. Thus, features defined by "first" and "second" may explicitly or implicitly include one or more of the features. In the descriptions of the present disclosure, "a plurality of" means two or more, unless otherwise definitely and specifically limited.

Many different implementations or examples are provided below to implement different structures of the present disclosure. To simplify the disclosure of the present disclosure, the following describes components and settings of particular examples. Certainly, the components and settings are merely examples, and are not intended to limit the present disclosure. In addition, in the present disclosure, reference numbers and/or reference letters may be repeated in different examples. Such repetition is intended to simplify and clarify the present disclosure, and does not indicate a relationship between various implementations and/or settings that are discussed. In addition, the present disclosure provides examples of various specific processes and materials, but a person skilled in the art may be aware of the applicability of other processes and/or the use of other materials.

The technical solutions of the present disclosure are described below with reference to specific embodiments.

Figure 1:
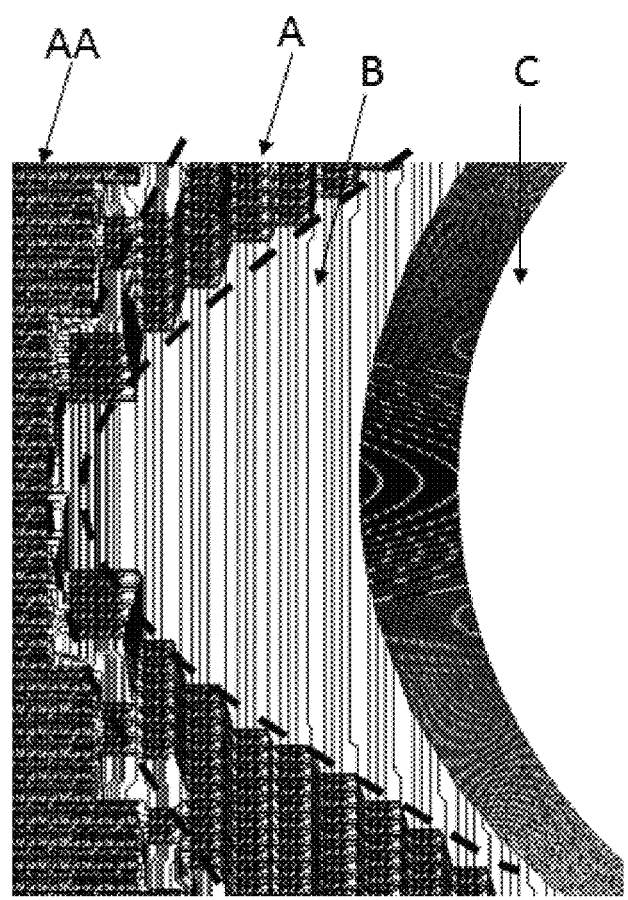
FIG. 1 is a design solution of a CUP area in the related art.

As shown in FIG. 1, FIG. 1 is a design solution of a CUP area in the related art. The display panel includes a normal display area AA and a CUP area TA. The CUP area TA includes a drive area A, a transition drive area B, and a high-transmittance area C. The drive area A is provided with a drive unit, and the high-transmittance area C is not provided with a drive unit. Therefore, display pixels located in the high-transmittance area C are electrically connected to the drive unit located in the drive area A through wiring disposed in the transition drive area B to emit light. In this way, the light transmittance of the high-transmittance area C is improved. However, metal wiring densities of the drive area A and the transition drive area B in this design solution are apparently different, which causes the problem of uneven display in the two areas, thereby severely affecting the display effect.

Referring to FIGS. 2A, 2B, 3, 4, and 5. The present disclosure provides a display panel, and more specifically, an organic light-emitting diode (OLED) display panel. The display panel includes a first display area 101 and a second display area 102. The first display area 101 includes a plurality of first display pixels 101p and a plurality of first pixel driving circuits 1011 that are arranged in an array, the first pixel driving circuits 1011 being electrically connected to the first display pixels 101p. The second display area 102 includes a transparent display area 102a, a drive display area 102c located between the transparent display area 102a and the first display area 101, and a transition display area 102b located between the transparent display area 102a and the drive display area 102c, and/or located between the drive display area 102c and the first display area 101.

Figure 2A:
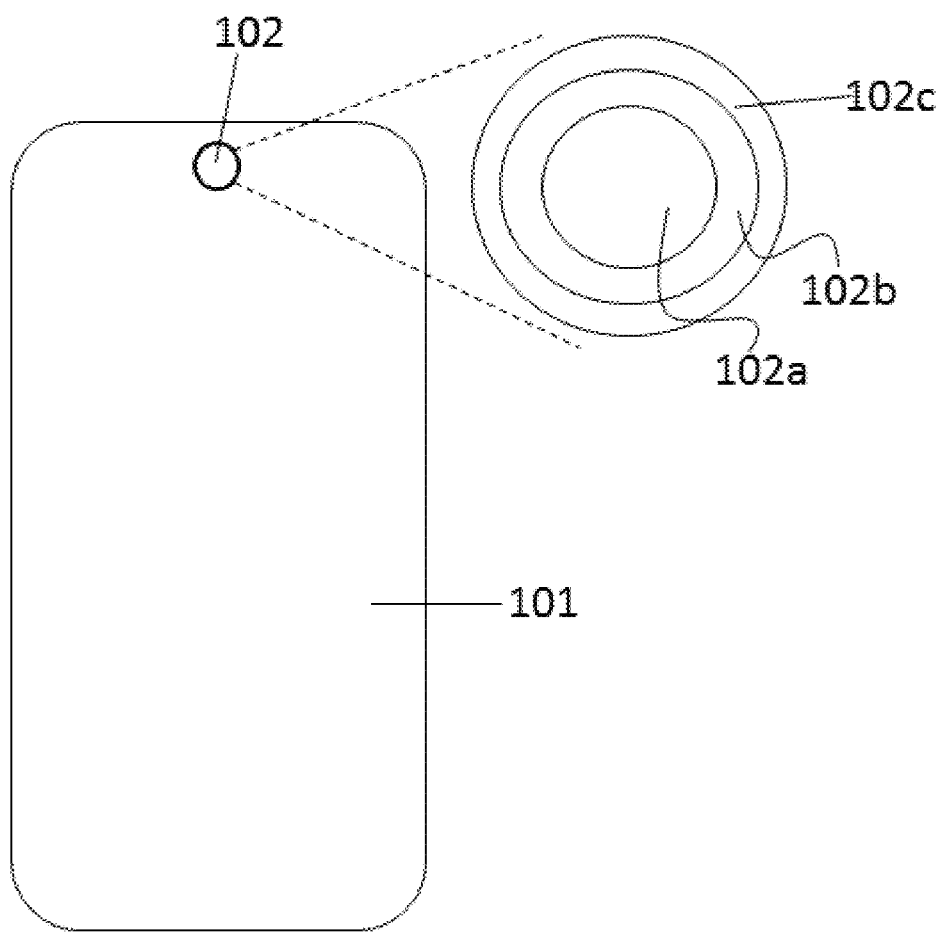
FIG. 2A is a first schematic diagram of a second display area according to an embodiment of the present disclosure.
Figure 2B:
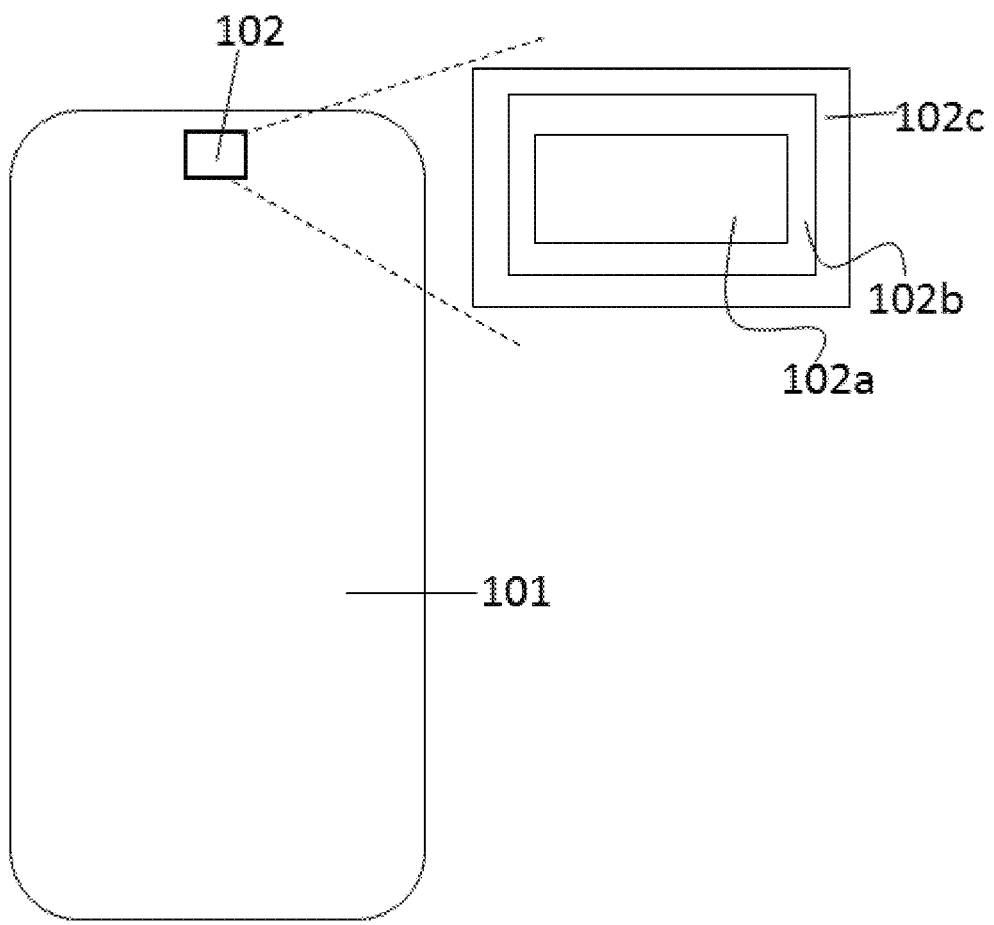
FIG. 2B is a second schematic diagram of a second display area according to an embodiment of the present disclosure.

It should be noted that although FIGS. 2A and 2B of the present disclosure only show that the transition display area 102b is located between the transparent display area 102a and the drive display area 102c, in another embodiment of the present disclosure, the transition display area 102b may alternatively be located between the drive display area 102c and the first display area 101.

The second display area 102 further includes a plurality of second display pixels 102p arranged in an array, the drive display area 102c includes a plurality of second pixel driving circuits 10211, the second pixel driving circuits 10211 are electrically connected to the second display pixels 102p, and the transition display area 102b includes a plurality of third pixel driving circuits 10221.

An arrangement density of the third pixel driving circuits 10221 in the transition display area 102b is less than or equal to an arrangement density of the second pixel driving circuits 10211 in the drive display area 102c.

Therefore, according to the present disclosure, the plurality of third pixel driving circuits 10221 are provided in the transition display area 102b, and the arrangement density of the third pixel driving circuits 10221 is less than or equal to the arrangement density of the second pixel driving circuits 10211 in the drive display area 102c. Therefore, the technical problem in the related art of uneven display in the drive area A and the transition drive area B due to the different metal wiring densities of the two areas can be resolved, thereby improving the display effect of a CUP area.

Further, the drive display area 102c includes a plurality of first pixel driving circuit islands 1021, and the first pixel driving circuit islands 1021 include the plurality of second pixel driving circuits 10211; and the transition display area 102b includes a plurality of second pixel driving circuit islands 1022, and the second pixel driving circuit islands 1022 include the plurality of third pixel driving circuits 10221.

As shown in FIGS. 2A and 2B, optionally, a shape of the transparent display area 102a includes one of an ellipse, a circle, or a rectangle, and shapes of the drive display area 102c and the transition display area 102b include one of an elliptical ring, a circular ring, or a square ring. A shape of the second display area 102 may be set according to specific conditions.

As can be understood, since the drive display area 102c and the transition display area 102b are arranged around the transparent display area 102a, the shapes of the drive display area 102c and the transition display area 102b vary in ring shapes with the shape of the transparent display area 102a.

Further, arrangement shapes of the first pixel driving circuit islands 1021 and the second pixel driving circuit islands 1022 are set according to the shapes of the drive display area 102*c* and the transition display area 102*b*. In the present embodiment, the arrangement shapes of the first pixel driving circuit islands 1021 and the second pixel driving circuit islands 1022 are elongated. The present disclosure is not limited thereto, and may be set according to specific conditions.

Preferably, the first pixel driving circuit islands 1021 and the second pixel driving circuit islands 1022 have the same arrangement shape (both are elongated in the present embodiment). Further, a metal wiring density of the transition display area 102*b* may be similar to a metal wiring density of the drive display area 102*c*, thereby alleviating the technical problem of uneven display caused by different light reflectivity due to different metal wiring densities.

Figure 3:
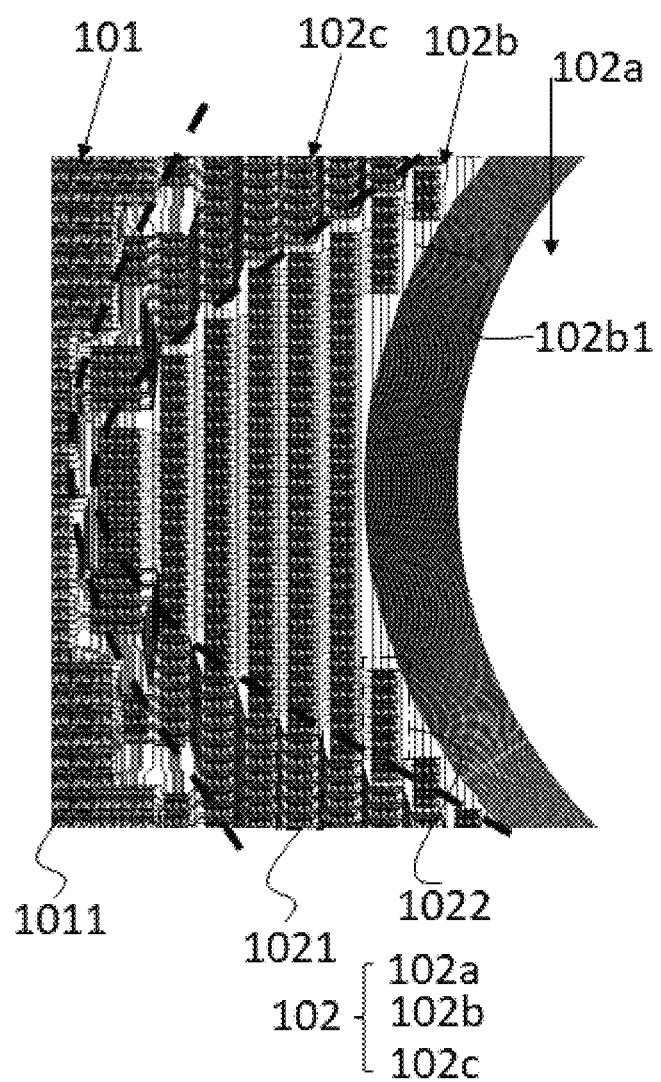
FIG. 3 is a schematic diagram of a structure of a transition display area according to an embodiment of the present disclosure.

As shown in FIG. 3, the circuit arrangement of the transition display area 102*b* is same or similar to that of the drive display area 102*c*, which can further effectively alleviate the problem of uneven display caused by different metal wiring densities in the two areas, thereby improving the display effect.

Specifically, in some embodiments of the present disclosure, an arrangement density of the first pixel driving circuit islands 1021 in the drive display area 102*c* is greater than or equal to an arrangement density of the second pixel driving circuit islands 1022 in the transition display area 102*b*. Therefore, the problem of uneven display caused by different metal wiring densities in the two areas can be further effectively alleviated, thereby improving the display effect.

Figure 5:
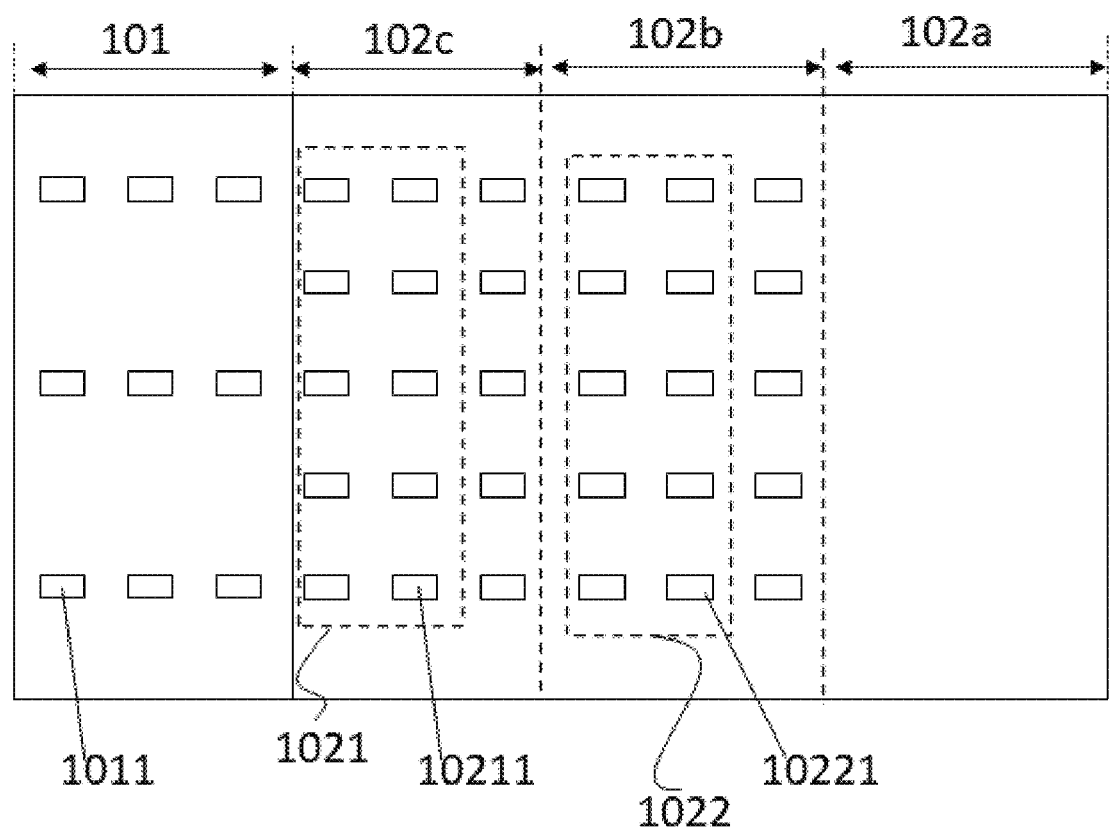
FIG. 5 is a schematic diagram of arrangement of pixel driving circuits according to an embodiment of the present disclosure.

Further, as shown in FIG. 5, an arrangement density of the second pixel driving circuits 10211 in an area occupied by the first pixel driving circuit islands 1021 is greater than or equal to an arrangement density of the third pixel driving circuits 10221 in an area occupied by the second pixel driving circuit islands 1022. That is, an arrangement density of the second pixel driving circuits 10211 in the drive display area 102*c* is greater than or equal to an arrangement density of the third pixel driving circuits 10221 in the transition display area 102*b*. Therefore, the problem of uneven display caused by different metal wiring densities in the two areas can be further effectively alleviated, thereby improving the display effect.

Further, an arrangement density of the first pixel driving circuits 1011 in the first display area 101 is less than an arrangement density of the second pixel driving circuits 10211 in the drive display area 102*c*.

As can be understood, when the arrangement density of the second pixel driving circuits 10211 in the drive display area 102*c* is equal to the arrangement density of the third pixel driving circuits 10221 in the transition display area 102*b*, the arrangement density of the first pixel driving circuits 1011 in the first display area 101 may be as similar as possible to the arrangement density of the third pixel driving circuits 10221 in the transition display area 102*b*, so that the first display area 101, the drive display area 102*c*, and the transition display area 102*b* have a uniform display effect, thereby improving the overall display effect of the display panel.

It should be noted that the arrangement and quantity of the first pixel driving circuits 1011 in the first display area 101, the arrangement and quantity of the second pixel driving circuits 10211 in the first pixel driving circuit islands 1021, and the arrangement and quantity of the third pixel driving circuits 10221 in the second pixel driving circuit islands 1022 in FIG. 5 are only examples. The present disclosure is not limited thereto, and may be set according to specific conditions.

Further, the third pixel driving circuits 10221 are not electrically connected to the first display pixels 101*p* and the second display pixels 102*p*. Specifically, the second pixel driving circuits 10211 provide driving signals to the second display pixels 102*p*, and the third pixel driving circuits 10221 do not provide driving signals to the first display pixels 101*p* and the second display pixels 102*p*.

As can be understood, the transition display area 102*b* further includes a signal wiring 102*b*1. The signal wiring 102*b*1 is not electrically connected to the third pixel driving circuits 10221 and is configured to transfer driving signals from the second pixel driving circuits 10211 to the second display pixels 102*p* of the transparent display area 102*a* to drive the second display pixels 102*p* to emit light. That is, the transparent display area 102*a* is not provided with a drive unit. Therefore, the second display pixels 102*p* located in the transparent display area 102*a* are electrically connected to the second pixel driving circuits 10211 in the drive display area 102*c* through the signal wiring 102*b*1 disposed in the transition display area 102*b* to emit light, thereby improving the light transmittance of the transparent display area 102*a*.

Therefore, according to the present disclosure, the third pixel driving circuits 10221 (that is, dummy driving circuits) that cannot drive the display pixels to emit light are provided in the transition display area 102*b* to increase the metal wiring density of the transition display area 102*b*. Therefore, without affecting the inherent circuit drive design of the display panel, the technical problem in the related art of uneven display in the drive area A and the transition drive area B due to the different metal wiring densities of the two areas can be resolved, thereby improving the display effect of a CUP area.

As can be understood, the third pixel driving circuits 10221 are not electrically connected to the second display pixel 102*p*. It means that driving signals cannot drive the second display pixels 102*p* through the second pixel driving circuit islands 1022 to emit light. Therefore, the third pixel driving circuits 10221 are configured as dummy driving circuits, to increase the metal wiring density of the transition display area 102*b* without affecting the inherent circuit drive design of the display panel. Further, the metal wiring density of the transition display area 102*b* may be similar to the metal wiring density of the drive display area 102*c*, thereby alleviating the technical problem of uneven display caused by different light reflectivity due to different metal wiring densities. Therefore, the display panel of the present disclosure can improve the display effect of the CUP area.

Figure 4:
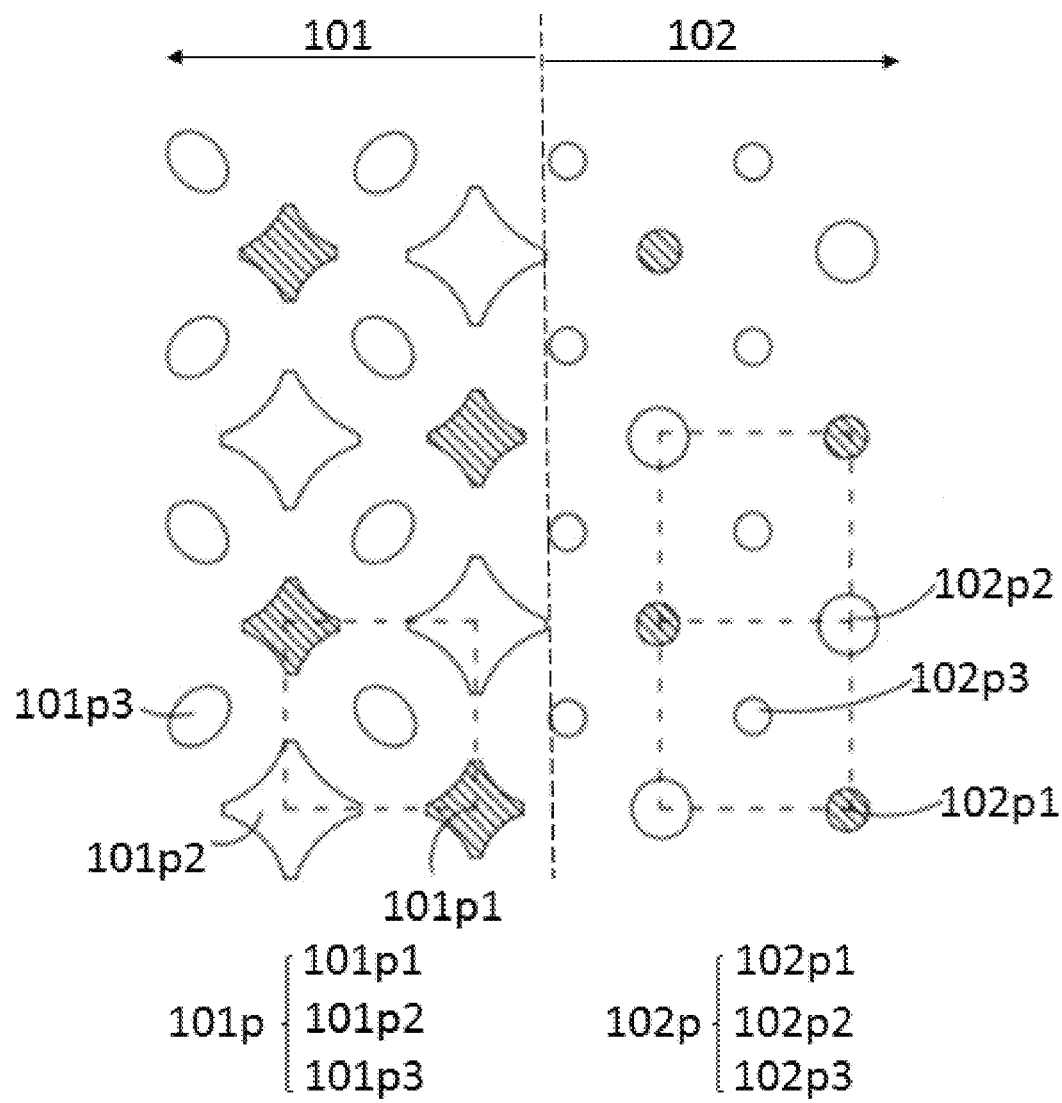
FIG. 4 is a schematic diagram of first display pixels and second display pixels according to an embodiment of the present disclosure.

As shown in FIG. 4, the plurality of first display pixels 101*p* are uniformly arranged in the first display area 101, and each first display pixel 101*p* includes a first red sub-pixel 101*p*1, a first green sub-pixel 101*p*3, and a first blue sub-pixel 101*p*2.

Specifically, the first red sub-pixel 101*p*1, the first green sub-pixel 101*p*3, and the first blue sub-pixel 101*p*2 are distributed in a Pentile design in the first display area 101. A shape of the first green sub-pixel 101*p*3 is an ellipse, and the first red sub-pixel 101*p*1 and the first blue sub-pixel 101*p*2 are octagonal. The first display area 101 described in the present disclosure may further include other pixel arrangements, which are not limited thereto.

Further, one first pixel driving circuit 1011 correspondingly drives one sub-pixel of the first display area 101 (that is, one of the first red sub-pixel 101*p*1, the first green sub-pixel 101*p*3, and the first blue sub-pixel 101*p*2) to emit light. The first pixel driving circuit 1011 may be any one of a common 7T1C, 6T1C, 5T1C, 4T1C, 3T1C, and 2T1C circuit.

As shown in FIG. 4, the plurality of second display pixels 102*p* are uniformly arranged in the second display area 102. That is, the plurality of second display pixels 102*p* are uniformly arranged in the transparent display area 102*a*, the drive display area 102*c*, and the transition display area 102*b*. Each second display pixel 102*p* includes a second red sub-pixel 102*p*1, a second green sub-pixel 102*p*3, and a second blue sub-pixel 102*p*2.

Specifically, the second red sub-pixel 102*p*1, the second green sub-pixel 102*p*3, and the second blue sub-pixel 102*p*2 are distributed in the Pentile design in the second display area 102. The shapes of the second red sub-pixel 102*p*1, the second green sub-pixel 102*p*3, and the second blue sub-pixel 102*p*2 are all circular. The second display area 102 described in the present disclosure may further include other pixel arrangements, which are not limited thereto.

A size of the first red sub-pixel 101*p*1 is larger than a size of the second red sub-pixel 102*p*1, a size of the first green sub-pixel 101*p*3 is larger than a size of the second green sub-pixel 102*p*3, and a size of the first blue sub-pixel 101*p*2 is larger than a size of the second blue sub-pixel 102*p*2, to ensure that the transparent display area 102*a* has a high light transmittance.

The second pixel driving circuits 10211 are configured to drive the second display pixels 102*p* to emit light. That is, the second pixel driving circuits 10211 of the first pixel driving circuit islands 1021 are further configured to drive the second display pixels 102*p* of the transparent display area 102*a* to emit light while driving the second display pixels 102*p* of the drive display area 102*c* and the transition display area 102*b* to emit light, to avoid that pixel driving circuits are disposed in the transparent display area 102*a*, and avoid that a metal film layer of the pixel driving circuits affects the light transmittance of the transparent display area 102*a*, thereby further improving the light transmittance of the transparent display area 102*a*.

One second pixel driving circuit 10211 may be configured to drive at least two of a plurality of second red sub-pixels 102*p*1, a plurality of second green sub-pixels 102*p*3, and a plurality of second blue sub-pixels 102*p*2, so as to reduce a quantity of second pixel driving circuits 10211 and reduce the space occupied by the first pixel driving circuit islands 1021. Therefore, the size of the transparent display area 102*a* can be increased.

In an embodiment of the present disclosure, the second pixel driving circuits 10211 and the third pixel driving circuits 10221 have the same circuit structure. The second pixel driving circuits 10211 and the third pixel driving circuits 10221 have the same circuit structure, so that the second pixel driving circuits 10211 and the third pixel driving circuits 10221 may have the same metal wiring density Therefore, the problem of uneven display caused by different metal wiring densities in the two areas can be effectively alleviated, thereby improving the display effect.

The circuit structure may be any one of a common 7T1C, 6T1C, 5T1C, 4T1C, 3T1C, and 2T1C circuit. The present disclosure uses the circuit structure and working principle of 7T1C as an example for description. However, the present disclosure is not limited thereto, and may be set according to specific conditions.

Figure 10:
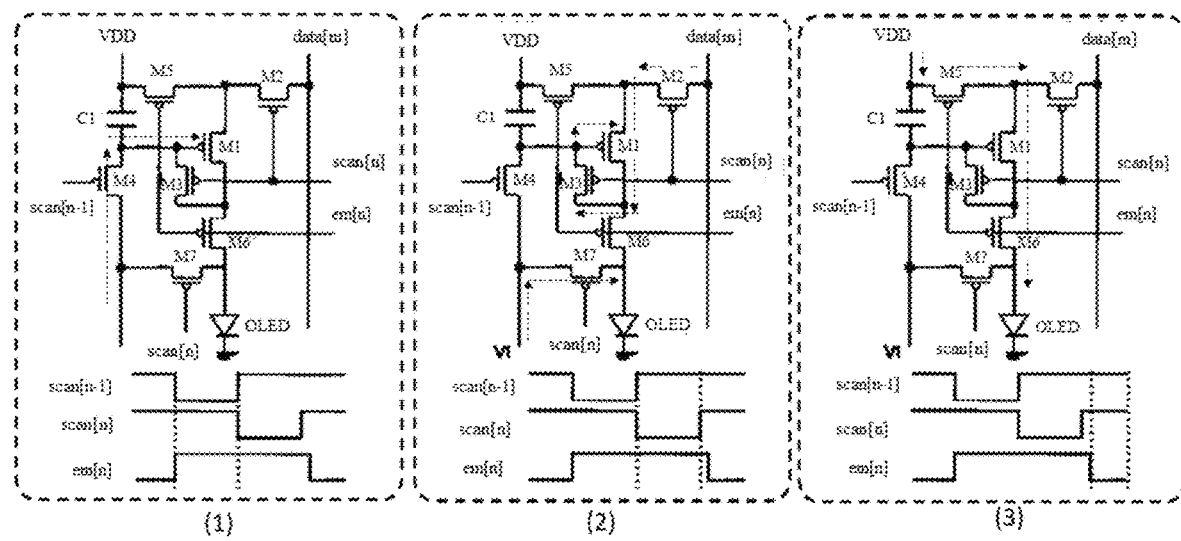
FIG. 10 is a schematic diagram of a working principle of a 7T1C circuit according to an embodiment of the present disclosure.

As shown in FIG. 10, the working principle of the 7T1C circuit may be divided into three steps. M1 to M7 respectively represent a first thin film transistor M1, a second thin film transistor M2, a third thin film transistor M3, a fourth thin film transistor M4, a fifth thin film transistor M5, a sixth thin film transistor M6, and a seventh thin film transistor M7. C1 represents a capacitor. An $n^{th}$-stage scan line scan[n] controls gate voltages of the second thin film transistor M2, the third thin film transistor M3, and the seventh thin film transistor M7. An $(n-1)^{th}$-stage scan line scan[n-1] controls a gate voltage of the fourth thin film transistor M4. An $n^{th}$-stage light-emitting control signal line em[n] controls gate voltages of the fifth thin film transistor M5 and the sixth thin film transistor M6.

The first step (1): the $(n-1)^{th}$-stage scan line scan[n-1] turns on the fourth thin film transistor M4. In this case, a reset signal of a reset line VI is at a low potential, and the gate of the first thin film transistor M1 is at a high potential. Therefore, the gate voltage of the first thin film transistor M1 is restored to the same voltage as the reset signal. This step is also resetting the gate of the first thin film transistor M1.

The second step (2): the $n^{th}$-stage scan line scan[n] is at a low potential and turns on the second thin film transistor M2, the third thin film transistor M3, and the seventh thin film transistor M7. In this case, a data signal data passes through the second thin film transistor M2 and the third thin film transistor M3 and is transmitted to the gate of the first thin film transistor M1, so that the gate voltage of the first thin film transistor M1 is gradually increased.

The third step (3): the $n^{th}$-stage light-emitting control signal line em[n] is at a low potential and turns on the fifth thin film transistor M5 and the sixth thin film transistor M6, so that a power supply voltage line VDD can transmit a signal to charge an anode through the fifth thin film transistor M5 and the sixth thin film transistor M6 to make an OLED emit light.

Figure 6:
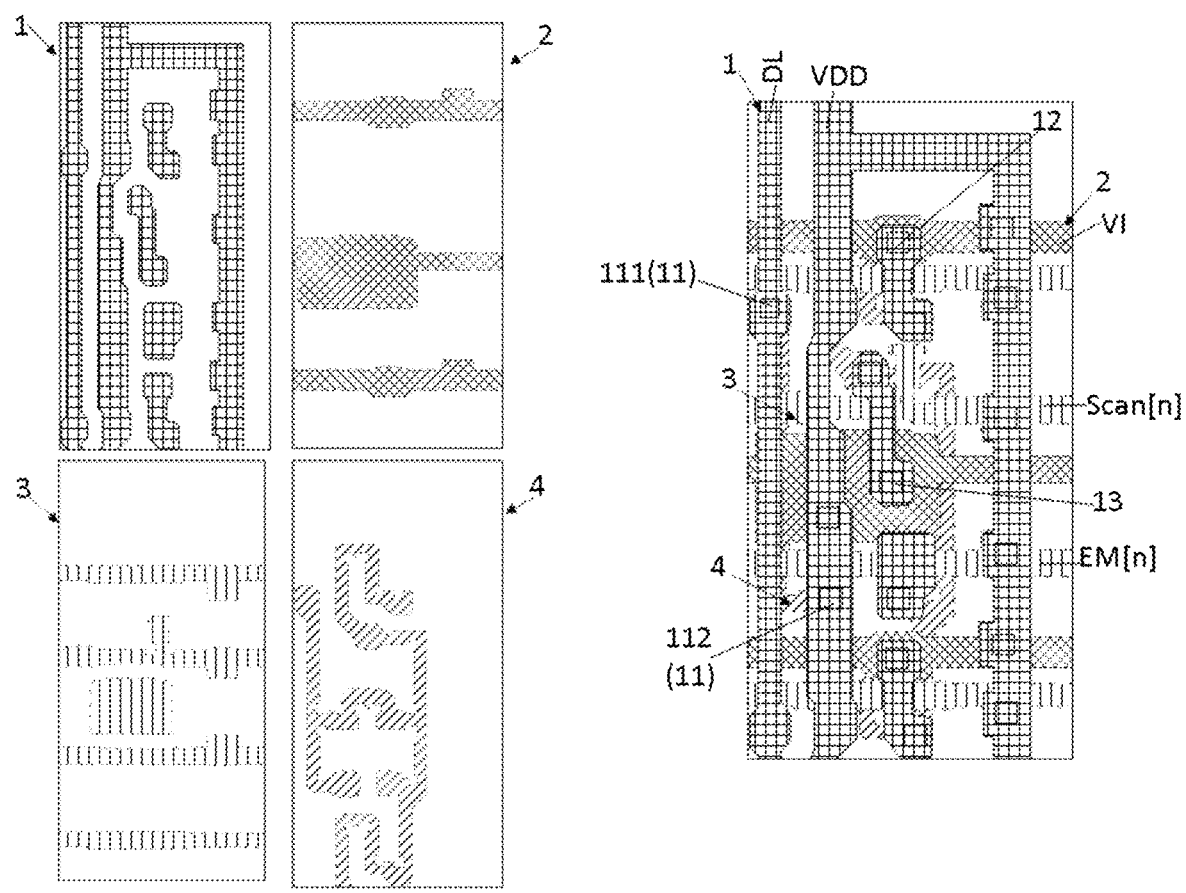
FIG. 6 is a schematic diagram of a planar structure of a second pixel driving circuit according to an embodiment of the present disclosure.

Specifically, as shown in FIG. 6, the second pixel driving circuit 10211 includes a semiconductor layer 4, a first metal layer 3, a second metal layer 2, and a third metal layer 1 stacked from bottom to top, the first metal layer 3 includes a scan line Scan and a light-emitting control signal line EM, the second metal layer 2 includes a reset line VI, the third metal layer 1 includes a data line DL and a power supply voltage line VDD, and the third metal layer 1 is electrically connected to the semiconductor layer 4, the second metal layer 2, and the first metal layer 3 using a first via 11, a second via 12, and a third via respectively 13.

As can be understood, the left side of FIG. 6 shows circuit patterns of the first metal layer 3, the second metal layer 2, the third metal layer 1, and the semiconductor layer 4. The right side of FIG. 6 shows a schematic diagram of the first metal layer 3, the second metal layer 2, the third metal layer 1 and the semiconductor layer 4 after being laminated. It should be noted that the small boxes representing the vias are shown in the figure in a perspective manner.

The third pixel driving circuit 10221 has the same or similar circuit structure as the second pixel driving circuit 10211, that is, the circuit patterns of the first metal layer 3, the second metal layer 2, the third metal layer 1 and the semiconductor layer 4 in the third pixel driving circuit 10221 are same as those of the second pixel driving circuit 10211. Therefore, the third pixel driving circuit 10221 includes the semiconductor layer 4, the first metal layer 3, the second metal layer 2, and the third metal layer 1 stacked from bottom to top, the first metal layer 3 includes the scan line Scan and the light-emitting control signal line EM, the second metal layer 2 includes the reset line VI, the third metal layer 1 includes the data line DL and the power supply voltage line VDD. The third pixel driving circuit 10221 is not provided with at least one of the first via 11, the second via 12, or the third via 13.

The data line DL is configured to transmit data signals. The power supply voltage line VDD is configured to transmit power supply voltage signals. The scan line Scan is configured to transmit scan signals. The reset line VI is configured to transmit reset signals and/or initialization signals. The light-emitting control signal line EM is configured to transmit light-emitting control signals.

Specifically, according to the present disclosure, the third pixel driving circuit 10221 is not provided with at least one of the first via 11, the second via 12, or the third via 13, so that the third pixel driving circuit 10221 is used as a dummy driving circuit, to increase the metal wiring density of the transition display area 102b without affecting the inherent circuit drive design of the display panel. Further, the metal wiring density of the transition display area 102b may be similar to the metal wiring density of the drive display area 102c, thereby alleviating the technical problem of uneven display caused by different light reflectivity due to different metal wiring densities.

In addition, in the present disclosure, the third pixel driving circuit 10221 has the same or similar circuit structure as the second pixel driving circuit 10211. Only electrically connected via structures between metal film layers in the third pixel driving circuit 10221 are remove. Only a digging step in the third pixel driving circuit 10221 is omitted without additional process steps. Therefore, the third pixel driving circuit 10221 and the second pixel driving circuit 10211 have the same or similar metal wiring density. Further, the drive display area 102c and the transition display area 102b can have a uniform display effect.

As can be understood, according to the present disclosure, the via structure required for a signal transmission path is removed, so that the signal transmission of the third pixel driving circuit 10221 is blocked without an additional process technology and without changing the inherent circuit drive design. Therefore, the third pixel driving circuit 10221 is used as a dummy driving circuit. Further, the metal wiring density of the transition display area 102b may be similar to the metal wiring density of the drive display area 102c, thereby alleviating the technical problem of uneven display caused by different light reflectivity due to different metal wiring densities.

Figure 7:
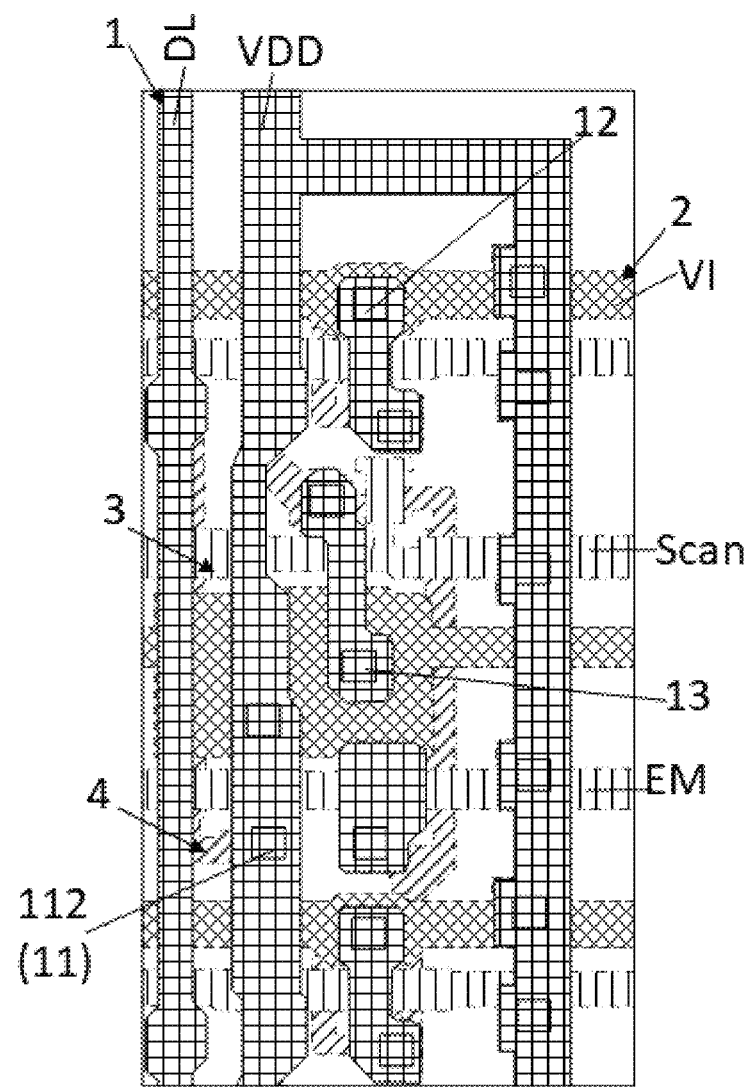
FIG. 7 is a schematic diagram of a first planar structure of a third pixel driving circuit according to an embodiment of the present disclosure.

Further, as shown in FIG. 7, in an embodiment of the present disclosure, the first via 11 includes a first sub-via 111 electrically connected to the data line DL and the semiconductor layer 4 and a second sub-via 112 electrically connected to the power supply voltage line VDD and the semiconductor layer 4, wherein the third pixel driving circuit 10221 is not provided with the first sub-via 111.

In the present embodiment, the first sub-via 111 electrically connected to the data line DL and the semiconductor layer 4 is removed. That is, a channel through which the data signal data in the second step (2) is transferred to the second thin film transistor M2 is turned off, which can prevent the data signal from being transmitted to the third pixel driving circuit 10221 through the data line DL. Therefore, the third pixel driving circuit 10221 cannot be turned on to drive display pixels to emit light. Therefore, the third pixel driving circuits 10221 are configured as dummy driving circuits, to increase the metal wiring density of the transition display area 102b without affecting the inherent circuit drive design of the display panel. Further, the metal wiring density of the transition display area 102b may be similar to the metal wiring density of the drive display area 102c, thereby alleviating the technical problem of uneven display caused by different light reflectivity due to different metal wiring densities.

In addition, only the first sub-via 111 in the third pixel driving circuit 10221 is removed. Only a digging step of the first sub-via 111 in the third pixel driving circuit 10221 is omitted without additional process steps. Therefore, the third pixel driving circuit 10221 and the second pixel driving circuit 10211 have the same or similar metal wiring density. Further, the drive display area 102c and the transition display area 102b can have a uniform display effect.

Figure 8:
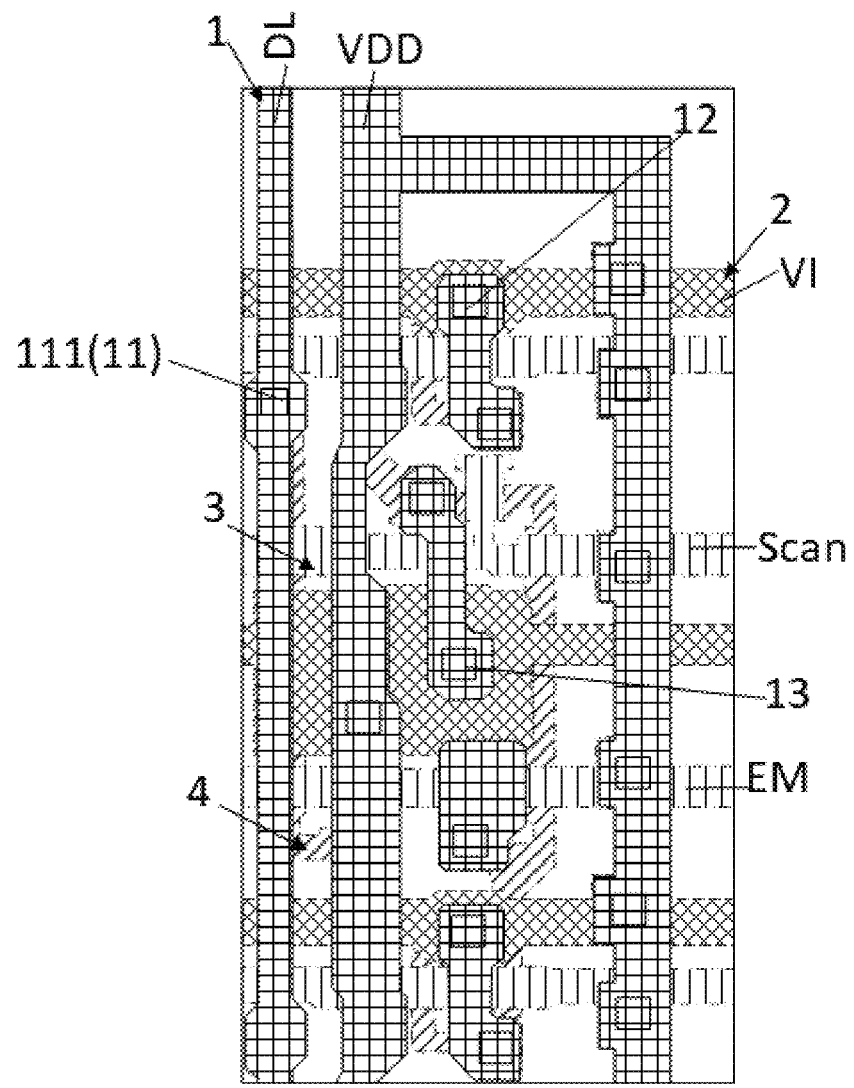
FIG. 8 is a schematic diagram of a second planar structure of a third pixel driving circuit according to an embodiment of the present disclosure.

Optionally, as shown in FIG. 8, in another embodiment of the present disclosure, the third pixel driving circuit 10221 is not provided with the second sub-via 112.

In the present embodiment, the second sub-via 112 electrically connected to the power supply voltage line VDD and the semiconductor layer 4 is removed. That is, a channel through which the power supply voltage signal in the third step (3) is transferred to the fifth thin film transistor M5 is turned off, which can prevent the power supply voltage signal from being transmitted to the third pixel driving circuit 10221 through the power supply voltage line VDD. Therefore, the third pixel driving circuit 10221 cannot be turned on to drive display pixels to emit light. Therefore, the third pixel driving circuits 10221 are configured as dummy driving circuits, to increase the metal wiring density of the transition display area 102b without affecting the inherent circuit drive design of the display panel. Further, the metal wiring density of the transition display area 102b may be similar to the metal wiring density of the drive display area 102c, thereby alleviating the technical problem of uneven display caused by different light reflectivity due to different metal wiring densities.

In addition, only the second sub-via 112 in the third pixel driving circuit 10221 is removed. Only a digging step of the second sub-via 112 in the third pixel driving circuit 10221 is omitted without additional process steps. Therefore, the third pixel driving circuit 10221 and the second pixel driving circuit 10211 have the same or similar metal wiring density. Further, the drive display area 102c and the transition display area 102b can have a uniform display effect.

Figure 9:
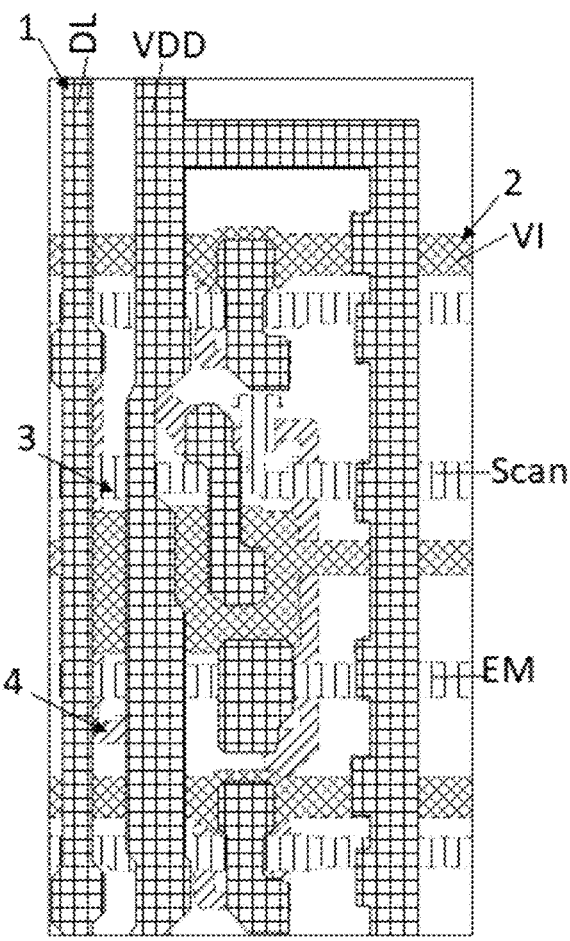
FIG. 9 is a schematic diagram of a third planar structure of a third pixel driving circuit according to an embodiment of the present disclosure.

Optionally, as shown in FIG. 9, in another embodiment of the present disclosure, the third pixel driving circuit 10221 is not provided with the first via 11, the second via 12, and the third via 13.

Specifically, in the present embodiment, all via structures in the third pixel driving circuit 10221 are removed. That is, channels of signal transmission paths in the first step (1) to the third step (3) are all turned off, so that all metal film layers are not electrically connected. Therefore, the third pixel driving circuit 10221 cannot be turned on to drive display pixels to emit light. Therefore, the third pixel driving circuits 10221 are configured as dummy driving circuits, to increase the metal wiring density of the transition display area 102b without affecting the inherent circuit drive design of the display panel. Further, the metal wiring density of the transition display area 102b may be similar to the metal wiring density of the drive display area 102c, thereby alleviating the technical problem of uneven display caused by different light reflectivity due to different metal wiring densities.

In addition, all via structures in the third pixel driving circuit 10221 are removed. Only a digging step of the via structures in the third pixel driving circuit 10221 is omitted without additional process steps. Therefore, the third pixel driving circuit 10221 and the second pixel driving circuit 10211 have a similar metal wiring density. Further, the drive display area 102c and the transition display area 102b can have a uniform display effect.

In the above embodiments, description of each embodiment focuses on a different part, and for parts that are not described in detail in one embodiment, reference may be made to the related description of other embodiments.

The embodiments of the present disclosure are described above in detail. Although the principles and implementations of the present disclosure are described by using specific examples in this specification, the descriptions of the above embodiments are merely intended to help understand the technical solutions and the core idea of the method of the present disclosure. It should be understood by a person of ordinary skill in the art that modifications can be made to the technical solutions described in the above embodiments, or equivalent replacements can be made to some technical features in the technical solutions, as long as such modifications or replacements do not cause the essence of corresponding technical solutions to depart from the scope of the technical solutions of the embodiments of the present disclosure.

What is claimed is:

1. A display panel, comprising:
   a first display area comprising a plurality of first display pixels and a plurality of first pixel driving circuits both arranged in an array, wherein the first pixel driving circuits are electrically connected to the first display pixels; and
   a second display area comprising a transparent display area, a drive display area located between the transparent display area and the first display area, and a transition display area located between the transparent display area and the drive display area, and/or located between the drive display area and the first display area, wherein
   the second display area further comprises a plurality of second display pixels arranged in an array, the drive display area comprises a plurality of second pixel driving circuits, the second pixel driving circuits are electrically connected to the second display pixels, and the transition display area comprises a plurality of third pixel driving circuits; and
   an arrangement density of the third pixel driving circuits in the transition display area is less than or equal to an arrangement density of the second pixel driving circuits in the drive display area.

2. The display panel as claimed in claim 1, wherein the drive display area comprises a plurality of first pixel driving circuit islands, and the first pixel driving circuit islands comprise the plurality of second pixel driving circuits; and
   the transition display area comprises a plurality of second pixel driving circuit islands, and the second pixel driving circuit islands comprise the plurality of third pixel driving circuits.

3. The display panel as claimed in claim 2, wherein an arrangement density of the first pixel driving circuit islands in the drive display area is greater than or equal to an arrangement density of the second pixel driving circuit islands in the transition display area.

4. The display panel as claimed in claim 2, wherein an arrangement density of the second pixel driving circuits in an area occupied by the first pixel driving circuit islands is greater than or equal to an arrangement density of the third pixel driving circuits in an area occupied by the second pixel driving circuit islands.

5. The display panel as claimed in claim 2, wherein an arrangement density of the first pixel driving circuits in the first display area is less than an arrangement density of the third pixel driving circuits in the transition display area.

6. The display panel as claimed in claim 1, wherein the third pixel driving circuits are not electrically connected to the first display pixels and the second display pixels.

7. The display panel as claimed in claim 1, wherein the second pixel driving circuits provide driving signals to the second display pixels, and the third pixel driving circuits do not provide driving signals to the first display pixels and the second display pixels.

8. The display panel as claimed in claim 6, wherein the second pixel driving circuit comprises a semiconductor layer, a first metal layer, a second metal layer, and a third metal layer stacked from bottom to top, the first metal layer comprises a scan line and a light-emitting control signal line, the second metal layer comprises a reset line, the third metal layer comprises a data line and a power supply voltage line, and the third metal layer is electrically connected to the semiconductor layer, the second metal layer, and the first metal layer through a first via, a second via, and a third via respectively; and
   the third pixel driving circuit comprises the semiconductor layer, the first metal layer, the second metal layer, and the third metal layer stacked from bottom to top, the first metal layer comprises the scan line and the light-emitting control signal line, the second metal layer comprises the reset line, the third metal layer comprises the data line and the power supply voltage line, and the third pixel driving circuit is not provided with at least one of the first via, the second via, or the third via.

9. The display panel as claimed in claim 8, wherein the first via comprises a first sub-via electrically connected to the data line and the semiconductor layer and a second sub-via electrically connected to the power supply voltage line and the semiconductor layer, and the third pixel driving circuit is not provided with the first sub-via and/or the second via.

10. The display panel as claimed in claim 8, wherein the third pixel driving circuit is not provided with the first via, the second via, and the third via.

11. The display panel as claimed in claim 7, wherein the second pixel driving circuit comprises a semiconductor layer, a first metal layer, a second metal layer, and a third metal layer stacked from bottom to top, the first metal layer comprises a scan line and a light-emitting control signal line, the second metal layer comprises a reset line, the third metal layer comprises a data line and a power supply voltage line, and the third metal layer is electrically connected to the semiconductor layer, the second metal layer, and the first metal layer through a first via, a second via, and a third via respectively; and
   the third pixel driving circuit comprises the semiconductor layer, the first metal layer, the second metal layer, and the third metal layer stacked from bottom to top, the first metal layer comprises the scan line and the light-emitting control signal line, the second metal layer comprises the reset line, the third metal layer comprises the data line and the power supply voltage line, and the third pixel driving circuit is not provided with at least one of the first via, the second via, or the third via.

12. The display panel as claimed in claim 11, wherein the first via comprises a first sub-via electrically connected to the data line and the semiconductor layer and a second sub-via electrically connected to the power supply voltage line and the semiconductor layer, and the third pixel driving circuit is not provided with the first sub-via and/or the second via.

13. The display panel as claimed in claim 11, wherein the third pixel driving circuit is not provided with the first via, the second via, and the third via.

\* \* \* \* \*